US008278026B2

(12) United States Patent
Xu et al.

(10) Patent No.: US 8,278,026 B2
(45) Date of Patent: Oct. 2, 2012

(54) METHOD FOR IMPROVING ELECTRON-BEAM

(75) Inventors: Qiuxia Xu, Beijing (CN); Gaobo Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/123,070

(22) PCT Filed: Feb. 15, 2011

(86) PCT No.: PCT/CN2011/070993
§ 371 (c)(1),
(2), (4) Date: Apr. 7, 2011

(87) PCT Pub. No.: WO2012/062058
PCT Pub. Date: May 18, 2012

(65) Prior Publication Data
US 2012/0115087 A1 May 10, 2012

(30) Foreign Application Priority Data
Nov. 10, 2010 (CN) .......................... 2010 1 0541030

(51) Int. Cl.
*G03C 5/00* (2006.01)
(52) U.S. Cl. ........ 430/296; 430/312; 430/313; 430/324; 430/325; 430/326; 430/327; 430/328; 430/330; 430/394; 430/942
(58) Field of Classification Search .................. 430/296, 430/312, 313, 324, 325, 326, 327, 328, 330, 430/394, 942
See application file for complete search history.

(56) References Cited

U.S. PATENT DOCUMENTS

2003/0211751 A1 11/2003 Lin ................................ 438/717
2005/0026084 A1 2/2005 Garza et al. ................... 430/311

FOREIGN PATENT DOCUMENTS

CN 1818788 8/2006
WO WO 2007/116362 10/2007

OTHER PUBLICATIONS

Search Report and Written Opinion from corresponding PCT application Serial No. PCT/CN2011/070993, dated Jul. 7, 2011.
"Electron Beam Lithography Application on the Nanofacbrication and Nonodevice" by C. Baoqin et al., *Expert Forum*, 2008, pp. 683-688, Abstract translated.

*Primary Examiner* — Christopher Young
(74) *Attorney, Agent, or Firm* — Westman, Champlin & Kelly, P.A.

(57) ABSTRACT

A method for improving the efficiency of the electron-beam exposure is provided, comprising: step 1) coating a positive photoresist on a wafer to be processed, and performing a pre-baking; step 2) separating pattern data, optically exposing a group of relatively large patterns, and then performing a post-baking; step 3) developing the positive photoresist; step 4) performing a plasma fluorination; step 5) performing a baking to solidify the photoresist; step 6) coating a negative electron-beam resist and performing a pre-baking; step 7) electron-beam exposing a group of fine patterns; step 8) performing a post-baking; and step 9) developing the negative electron-beam resist, so that the fabrication of the patterns is finished. According to the invention, it is possible to save 30-60% of the exposure time. Thus, the exposure efficiency is significantly improved, and the cost is greatly reduced. Further, the method is totally compatible with the CMOS processes, without the need of any special equipments.

7 Claims, 1 Drawing Sheet

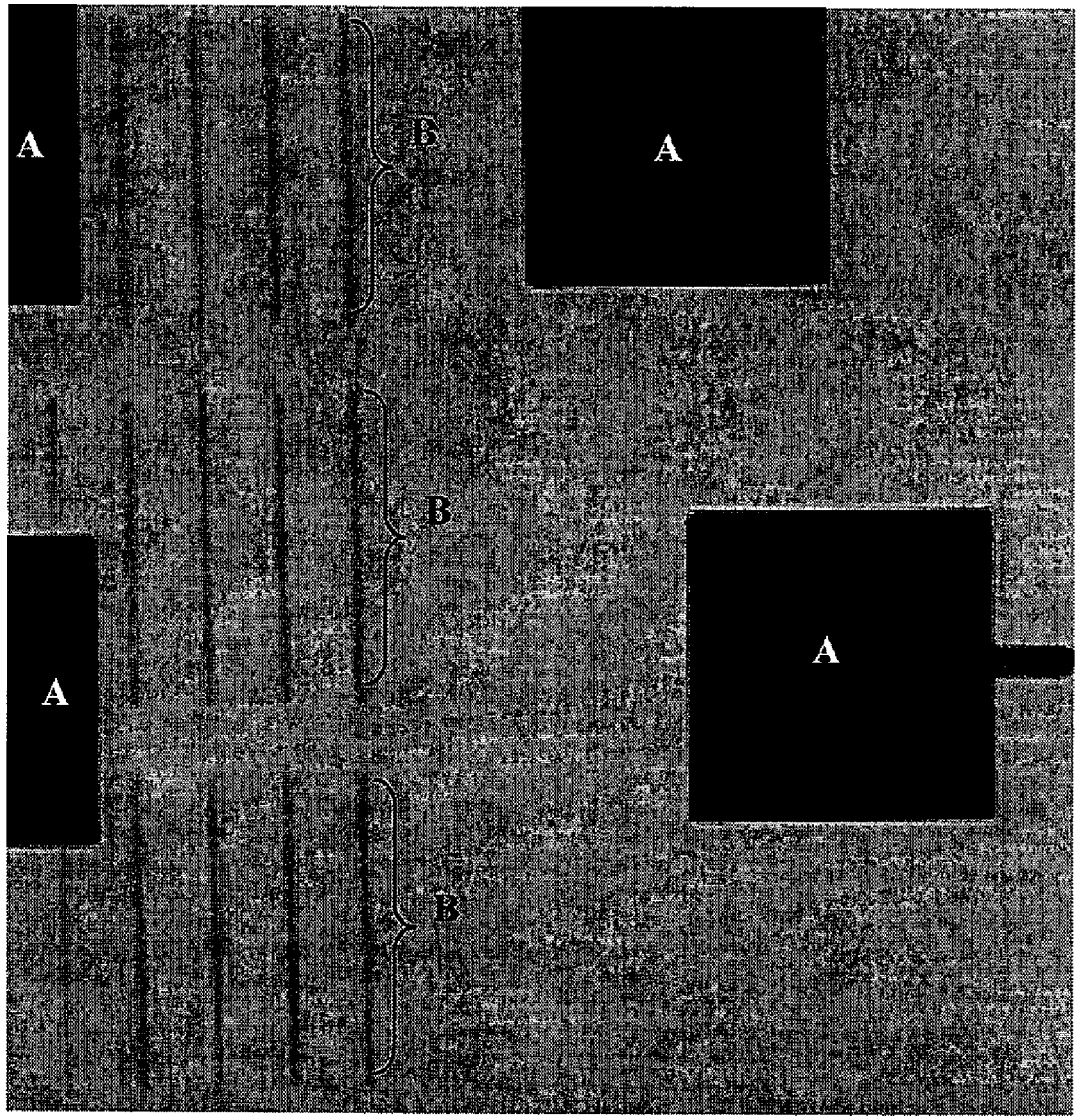

METHOD FOR IMPROVING ELECTRON-BEAM

CROSS-REFERENCE TO RELATED APPLICATION

This Application is a Section 371 National Stage Application of International Application No. PCT/CN2011/070993, filed Feb. 15, 2011, not yet published, the contents of which are hereby incorporated by reference in their entirety.

FIELD OF INVENTION

The present invention generally relates to the fabrication processes of semiconductor devices in nanometer scale, and more particularly, to a method for improving the electron-beam exposure efficiency in forming nanometer patterns, so as to expedite the processes of forming the nanometer patterns and to greatly reduce the cost.

BACKGROUND

In the fabrication of devices and integrated circuits of sub-50 nm, a key problem is how to obtain patterns of sub-50 nm by lithography. As the patterns are so fine, it is very difficult to achieve them by nowadays optical photolithography technology. An efficient way to achieve them is the electron-beam lithography. However, the electron-beam lithography has disadvantages of low exposure speed and low exposure efficiency, which significantly impact the researches and developments.

SUMMARY OF THE INVENTION

An object of the present invention is to provide a method for improving the efficiency of the electron-beam exposure to overcome the defects in the existing prior art.

To achieve the above object, patterns to be formed by lithography are separated into two groups, wherein one group of relatively large patterns is to be formed by optical exposure, and the other group of fine patterns is to be formed by electron-beam exposure. Further, the present invention also solves the problem of compatibility between these two kinds of lithographs and enables the practical use of the present invention.

Specifically, according to an aspect of the invention, there is provided a method for improving the efficiency of the electron-beam exposure, mainly comprising:

step 1) coating a positive photoresist on a wafer to be processed, and performing a pre-baking;
step 2) separating pattern data, optically exposing the group of relatively large patterns, and then performing a post-baking;
step 3) developing the positive photoresist;
step 4) performing a plasma fluorination;
step 5) performing a baking to solidify the photoresist;
step 6) coating a negative electron-beam resist and performing a pre-baking;
step 7) electron-beam exposing the group of fine patterns;
step 8) performing a post-baking; and
step 9) developing the negative electron-beam resist to finish the fabrication is of the patterns.

Preferably, in step 1), the positive photoresist has a thickness of 200-400 nm, and the pre-baking is performed with a hot-plate at temperature of 90-95° C. for 60-90 seconds.

Preferably, in step 2), the exposing of the group of relatively large patterns is conducted by a stepper lithography, and the post-baking is performed with a hot plate at temperature of 100-115° C. for 60-90 seconds.

Preferably, in step 4), the plasma fluorination is performed for 20-60 seconds, with a power of 30-60 W, a pressure of 300-550 mTorr, and a reaction gas of $CF_4$ having a flow rate of 100-300 sccm.

Preferably, in step 5), the baking is performed with a temperature of 130-160° C. for 40-60 minutes.

Preferably, in step 6), the negative electron-beam resist has a thickness of 200-400 nm, and the pre-baking is performed with a hot-plate at temperature of 100-115° C. for 1-3 minutes.

Preferably, in step 8), the post-baking is performed with a hot-plate temperature of 100-115° C. for 1-3 minutes.

The present invention achieves the following advantages.

1) By combining the two kinds of lithography technologies, the problem of low efficiency of the electron-beam exposure is solved.

2) The data of the pattern to be exposed are separated, so that one group of relatively large patterns is fabricated by means of the optical exposure and the other group of fine patterns is fabricated by means of the electron-beam exposure. As a result, it is possible not only to improve the speed of fabricating the patterns, but also to ensure the high accuracy and resolution required for the fine patterns.

3) The manufacture process is expedited, and thus the cost is significantly reduced.

4) The process is simple and completely compatible with CMOS processes, without the need of additional equipments.

BRIEF DESCRIPTION OF THE DRAWINGS

FIG. 1 shows the resist patterns formed by two kinds of lithography technologies according to the present invention, wherein relatively large patterns (A) are fabricated by optically exposing a positive photoresist, and fine patterns (B) with a line width of about 50-60 nm are fabricated by electron-beam exposing a negative electron-beam resist.

DETAILED DESCRIPTION OF PREFERRED EMBODIMENTS

In order to solve the problem that the speed of the electron-beam lithography is very slow, the present invention provides a method for addressing the low efficiency of the electro-beam exposure. Specifically, patterns to be formed by lithography are classified into two groups, wherein one group of relatively large patterns is to be made by optical exposure, and the other group of fine patterns is to be made by the electron-beam exposure. To make these two kinds of lithography means compatible with each other, that is, to prevent the photoresist patterns of relatively large sizes formed by the optical exposure from being resolved or damaged during the developing step of the electro-beam lithography procedure, the present invention proposes to use a positive photoresist for the optical lithography, which, after developing, is subjected to a fluorination process and a baking process for being solidified so as to improve its resistance to dissolution and damage, and then to apply a negative electron-beam resist, which is subjected to electron-beam exposure and developing process to form the fine patterns. Thus, the electron-beam lithography procedure will not impact the integrity of the morphology of the positive photoresist patterns which have already been formed. As a result, the present invention is feasible in practical use.

The method according to the present invention mainly comprises the following steps:

Step 1) coating a positive photoresist on a wafer to be processed, with a film thickness of 200-400 nm; performing a pre-baking, with a hot-plate at temperature of 90-95° C., for 60-90 seconds;

Step 2) separating the pattern data; optically exposing a group of relatively large patterns by a stepper lithography; then, performing a post-baking, with a hot plate at temperature of 100-110° C., for 1-1.5 minute;

Step 3) performing a developing process for 40-60 seconds;

Step 4) performing a plasma fluorination, with a low power of 30-60 W, a pressure of 300-600 mTorr, and a $CF_4$ flow of 100-200, for 20-60 seconds;

Step 5) performing a baking to solidify the photoresist, with an oven temperature of 130-160° C., for 40-60 minutes;

Step 6) coating a negative electron-beam resist with a thickness of 200-400 nm; then, performing a pre-baking, with a hot-plate at temperature of 100-115° C., for 1-3 minutes;

Step 7) electron-beam exposing a group of fine patterns;

Step 8) performing a post-baking, with a hot-plate at temperature of 100-115° C., for 1-3 minutes; and Step 9) performing a developing process, so that the fabrication of the patterns is to finished.

Hereinafter, an example is described to exemplify the present invention, but not to limit the present invention.

Step 1) coating a positive photoresist on a wafer where gate patterns are to be fabricated, with a film thickness of 300-400 nm; performing a pre-baking with a hot-plate at temperature of 95° C. for 60 seconds;

Step 2) separating the pattern data; optically exposing a group of relatively large patterns; then, performing a post-baking with a hot plate at temperature of 100-110° C. for 1 minute;

Step 3) developing the positive photoresist for 50-60 seconds;

Step 4) performing a plasma fluorination for 30-50 seconds, with a power of 40 W, a pressure of 400-500 mTorr, and a $CF_4$ flow of 100-120 sccm;

Step 5) performing a baking to solidify the photoresist at temperature of 140-160° C. for 40-50 minutes;

Step 6) coating a negative electron-beam resist with a thickness of 300-400 nm; then, performing a pre-baking with a hot-plate at temperature of 100-110° C. for 1-3 minutes;

Step 7) electron-beam exposing a group of fine patterns;

Step 8) performing a post-baking with a hot-plate at temperature of 100-110° C. for 1-3 minutes; and Step 9) developing the negative electron-beam resist with the CD-26 developing agent for 6-7 minutes, so that the fabrication of the patterns is finished.

FIG. 1 shows patterns fabricated according to the present invention, wherein relatively large patterns (A) are fabricated by optically exposing the positive photoresist, and fine patterns (B) with a line width of about 50-60 nm are fabricated by electron-beam exposing the negative electron-beam resist.

What is claimed is:

1. A method for improving the efficiency of an electron-beam exposure, comprising:
    step 1) coating a positive photoresist on a wafer on which patterns will be formed, and performing a pre-baking;
    step 2) separating data of the patterns into a group of relatively large patterns and a group of fine patterns, optically exposing the group of relatively large patterns, and performing a post-baking;
    step 3) developing the positive photoresist;
    step 4) performing a plasma fluorination;
    step 5) performing a baking for solidifying the photoresist;
    step 6) coating a negative electron-beam resist and performing a pre-baking;
    step 7) electron-beam exposing the group of fine patterns;
    step 8) performing a post-baking; and
    step 9) developing the negative electron-beam resist, so that the fabrication of the patterns is finished.

2. The method according to claim 1, wherein in step 1), the positive photoresist has a thickness of 200-400 nm, and the pre-baking is performed with a hot-plate at temperature of 90-95° C. for 60-90 seconds.

3. The method according to claim 1, wherein in step 2), the step of exposing the group of relatively large patterns is performed by a stepper lithography and the post-baking is performed with a hot plate at temperature of 100-115° C. for 60-90 seconds.

4. The method according to claim 1, wherein in step 4), the plasma fluorination is performed for 20-60 seconds, with a power of 30-60 W, a pressure of 300-550 mTorr, and a reaction gas of $CF_4$ having a flow rate of 100-300 sccm.

5. The method according to claim 1, wherein in step 5), the baking for solidifying the photoresist is performed with a temperature of 130-160° C. for 40-60 minutes.

6. The method according to claim 1, wherein in step 6), the negative electron-beam resist has a thickness of 200-400 nm, and the pre-baking is performed with a hot-plate at temperature of 100-115° C. for 1-3 minutes.

7. The method according to claim 1, wherein in step 8), the post-baking is performed with a hot-plate at temperature of 100-115° C. for 1-3 minutes.

* * * * *